(12) United States Patent
McVay et al.

(10) Patent No.: US 10,776,200 B2
(45) Date of Patent: Sep. 15, 2020

(54) XOR PARITY MANAGEMENT ON A PHYSICALLY ADDRESSABLE SOLID STATE DRIVE

(71) Applicant: Intel Corporation, Santa Clara, CA (US)

(72) Inventors: Jeffrey McVay, El Dorado Hills, CA (US); Joseph Edgington, Folsom, CA (US); Mark Leinwander, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 157 days.

(21) Appl. No.: 16/019,990

(22) Filed: Jun. 27, 2018

(65) Prior Publication Data

US 2019/0042361 A1 Feb. 7, 2019

(51) Int. Cl.
*G11C 29/00* (2006.01)
*G06F 11/00* (2006.01)
*G06F 11/10* (2006.01)
*G11C 29/52* (2006.01)

(52) U.S. Cl.
CPC ...... *G06F 11/1068* (2013.01); *G06F 11/1076* (2013.01); *G11C 29/52* (2013.01)

(58) Field of Classification Search
CPC ... G06F 11/1068; G06F 11/1076; G11C 29/52
USPC ....... 714/763, 766, 769, 770, 773, 799, 780, 714/781, 782, 758, 751, 752
See application file for complete search history.

(56) References Cited

U.S. PATENT DOCUMENTS

| | | | |
|---|---|---|---|
| 2015/0254134 A1* | 9/2015 | Suzuki | G06F 3/064 714/760 |
| 2018/0219562 A1* | 8/2018 | Lee | G06F 11/1012 |
| 2018/0341549 A1* | 11/2018 | Bolkhovitin | G06F 11/1068 |
| 2019/0065306 A1* | 2/2019 | Margetts | G06F 11/1068 |

OTHER PUBLICATIONS

"Open-Channel Solid State Drives Specification," lightnvm.io/docs/OCSSD-2_0-20180129.pdf, Jan. 29, 2018, 29 pages.

* cited by examiner

*Primary Examiner* — Christine T. Tu
(74) *Attorney, Agent, or Firm* — Jordan IP Law, LLC

(57) ABSTRACT

An embodiment of a semiconductor apparatus may include technology to provide information related to one or more parity capabilities of a controller and a persistent storage media in response to an inquiry from a host device, and adjust one or more parameters related to the one or more parity capabilities of the controller and the persistent storage media in response to a request from the host device. Other embodiments are disclosed and claimed.

25 Claims, 24 Drawing Sheets

| Bytes | Description |
|---|---|
| 3:0 | Log version |
| 7:4 | Log Size: The total size of the log in bytes. |
| 11:0 | Hardware Parity Contexts: The number of unique PCBs supported by hardware. A 0 value indicates that no parity contexts are supported. |
| 15:12 | Minimum PCB size: The minimum size of a PCB in Logical Blocks. |
| 19:16 | Maximum PCB size: The maximum size of a PCB in Logical Blocks. |
| 23:20 | $PCID_0$ restored. |
| 27:24 | $PCID_1$ restored. |
| ... | $PCID_{...}$ restored. |
| (N*4)+19:(N*4)+16 | $PCID_N$ restored. |

FIG. 6

| Bytes | Dword | Description |
|---|---|---|
| 03:00 | 0 | CDW0 |
| 07:04 | 1 | NSID |
| 11:08 | 2 | Reserved |
| 15:12 | 3 | |
| 19:16 | 4 | |
| 23:20 | 5 | |
| 27:24 | 6 | |
| 31:28 | 7 | |
| 35:32 | 8 | |
| 39:36 | 9 | |
| 43:40 | 10 | PCID |
| 47:44 | 11 | Reserved |
| 51:48 | 12 | |
| 55:52 | 13 | |
| 59:56 | 14 | |
| 63:60 | 15 | |

FIG. 7

| Bytes | Dword | Description |
|---|---|---|
| 03:00 | 0 | CDW0 |
| 07:04 | 1 | NSID |
| 11:08 | 2 | Reserved |
| 15:12 | 3 | |
| 19:16 | 4 | |
| 23:20 | 5 | |
| 27:24 | 6 | DPTR |
| 31:28 | 7 | |
| 35:32 | 8 | |
| 39:36 | 9 | |
| 43:40 | 10 | PCID |
| 47:44 | 11 | Reserved |
| 51:48 | 12 | NDT |
| 55:52 | 13 | Reserved |
| 59:56 | 14 | |
| 63:60 | 15 | |

FIG. 8

| Bytes | Dword | Description |
|---|---|---|
| 03:00 | 0 | CDW0 |
| 07:04 | 1 | NSID |
| 11:08 | 2 | Reserved |
| 15:12 | 3 | |
| 19:16 | 4 | |
| 23:20 | 5 | |
| 27:24 | 6 | DPTR |
| 31:28 | 7 | |
| 35:32 | 8 | |
| 39:36 | 9 | |
| 43:40 | 10 | PCID |
| 47:44 | 11 | Bit 31;<br>    1 - Data is accumulated into the parity context buffer.<br>    0 - Buffer is overwritten.<br>Bits 30:0;<br>    Reserved |
| 51:48 | 12 | NDT |
| 55:52 | 13 | Reserved |
| 59:56 | 14 | |
| 63:60 | 15 | |

FIG. 9

| Bytes | Dword | Description |
|---|---|---|
| 03:00 | 0 | CDW0 |
| 07:04 | 1 | NSID |
| 11:08 | 2 | PCID 0 |
| 15:12 | 3 | PCID 1 optional |
| 19:16 | 4 | MPTR |
| 23:20 | 5 | |
| 27:24 | 6 | DPTR |
| 31:28 | 7 | |
| 35:32 | 8 | |
| 39:36 | 9 | |
| 43:40 | 10 | OCSSD LBA |
| 47:44 | 11 | |
| 51:48 | 12 | Bit 31, PCID0 behavior;<br>   1 - Data is accumulated into the parity context buffer.<br>   0 - Buffer is overwritten.<br>Bit 30, PCID1 behavior optional;<br>   1 - Data is accumulated into the parity context buffer.<br>   0 - Buffer is overwritten.<br>Bits 29:0;<br>   Reserved. |
| 55:52 | 13 | CDW13 |
| 59:56 | 14 | CDW14 |
| 63:60 | 15 | CDW15 |

FIG. 10

| Bytes | Dword | Description |
|---|---|---|
| 03:00 | 0 | CDW0 |
| 07:04 | 1 | NSID |
| 11:08 | 2 | PCID 0 |
| 15:12 | 3 | Reserved |
| 19:16 | 4 | Reserved |
| 23:20 | 5 | |
| 27:24 | 6 | Reserved |
| 31:28 | 7 | |
| 35:32 | 8 | |
| 39:36 | 9 | |
| 43:40 | 10 | OCSSD LBA |
| 47:44 | 11 | |
| 51:48 | 12 | Bit 31 Optional;<br>   1 – Parity Buffer Initialized<br>   0 – Parity Buffer Preserved<br>Bits 30:16;<br>   Reserved<br>Bits 15:0;<br>   NLB |
| 55:52 | 13 | Reserved |
| 59:56 | 14 | Reserved |
| 63:60 | 15 | Reserved |

FIG. 11

| Bytes | Dword | Description |
|---|---|---|
| 03:00 | 0 | CDW0 |
| 07:04 | 1 | NSID |
| 11:08 | 2 | PCID 0 |
| 15:12 | 3 | Reserved |
| 19:16 | 4 | Reserved |
| 23:20 | 5 | |
| 27:24 | 6 | Reserved |
| 31:28 | 7 | |
| 35:32 | 8 | |
| 39:36 | 9 | |
| 43:40 | 10 | OCSSD LBA |
| 47:44 | 11 | |
| 51:48 | 12 | Bits 31:16 Reserved<br>Bits 15:0 NLB |
| 55:52 | 13 | Reserved |
| 59:56 | 14 | Reserved |
| 63:60 | 15 | Reserved |

FIG. 12

XOR PARITY MANAGEMENT ON A PHYSICALLY ADDRESSABLE SOLID STATE DRIVE

TECHNICAL FIELD

Embodiments generally relate to storage systems. More particularly, embodiments relate to XOR parity management on a physically addressable solid state drive (SSD).

BACKGROUND

A solid-state drive (SSD) may include non-volatile memory (NVM) technology. Access to the contents of the SSD may be supported with a protocol such as NVM EXPRESS (NVMe), Revision 1.3, published May 2017 (nvmexpress.org). The Open-Channel Solid State Drives (OCSSD) specification, Revision 2.0, published Jan. 29, 2018 (http://lightnvm.io) describes a physical page addressing command set extension to the NVMe specification.

BRIEF DESCRIPTION OF THE DRAWINGS

The various advantages of the embodiments will become apparent to one skilled in the art by reading the following specification and appended claims, and by referencing the following drawings, in which:

FIG. 6 is an illustrative diagram of an example data structure of a parity context information log according to an embodiment;

FIG. 7 is an illustrative diagram of an example data structure of an initialize parity context buffer administration command according to an embodiment;

FIG. 8 is an illustrative diagram of an example data structure of a read parity context administration command according to an embodiment;

FIG. 9 is an illustrative diagram of an example data structure of a write parity context administration command according to an embodiment;

FIG. 10 is an illustrative diagram of an example data structure of a write with parity input/output command according to an embodiment;

FIG. 11 is an illustrative diagram of an example data structure of a flush parity context input/output command according to an embodiment;

FIG. 12 is an illustrative diagram of an example data structure of a read accumulate input/output command according to an embodiment;

DESCRIPTION OF EMBODIMENTS

Various embodiments described herein may include a memory component and/or an interface to a memory component. Such memory components may include volatile and/or nonvolatile memory. Nonvolatile memory may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at jedec.org).

Volatile memory may be a storage medium that requires power to maintain the state of data stored by the medium. Non-limiting examples of volatile memory may include various types of RAM, such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

Figure 1:
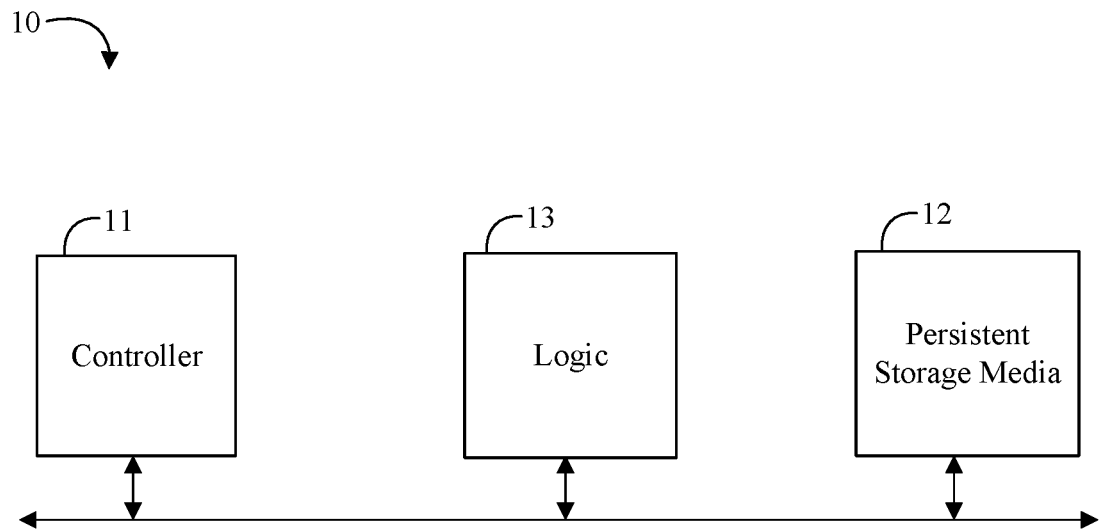
FIG. 1 is a block diagram of an example of an electronic processing system according to an embodiment.

Turning now to FIG. 1, an embodiment of an electronic processing system 10 may include a controller 11, persistent storage media 12 communicatively coupled to the controller 11, and logic 13 communicatively coupled to the controller 11 and the persistent storage media 12 to provide information related to one or more parity capabilities of the controller 11 and the persistent storage media 12 in response to an inquiry from a host device, and adjust one or more parameters related to the one or more parity capabilities of the controller 11 and the persistent storage media 12 in response to a request from the host device. In some embodiments, the logic 13 may be configured to perform parity accumulation on the persistent storage media 12 in response to a request from the host device. Additionally, or alternatively, the logic 13 may be configured to perform parity storage on the persistent storage media 12 in response to a request from the host device, and/or to perform parity-based rebuild on the persistent storage media 12 in response to a request from the host device. In some embodiments, the logic 13 may be configured to process parity administration commands and input/output (I/O) commands including one or more of a supported parity contexts inquiry administration command, a clear parity administration command, a read parity administration command, a write parity administration command, a write with parity I/O command, a flush parity I/O command, and a read accumulate I/O command. In any of the embodiments herein, the persistent storage media 12 may include a SSD device. In some embodiments, the logic 13 may be located in, or co-located with, various components, including the controller 11 (e.g., on a same die).

Embodiments of each of the above controller 11, persistent storage media 12, logic 13, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the controller 11 may include a general purpose controller, a special purpose controller (e.g., a storage controller), a micro-controller, a processor, a central processor unit (CPU), a micro-processor, etc.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the persistent storage media 12, other persistent storage media, or other memory may store a set of instructions which when executed by the controller 11 cause the system 10 to implement one or more components, features, or aspects of the system 10 (e.g., the logic 13, providing information related to parity capabilities of the controller 11 and/or the persistent storage media 12, adjusting parameters related to the parity capabilities, etc.).

Figure 2:
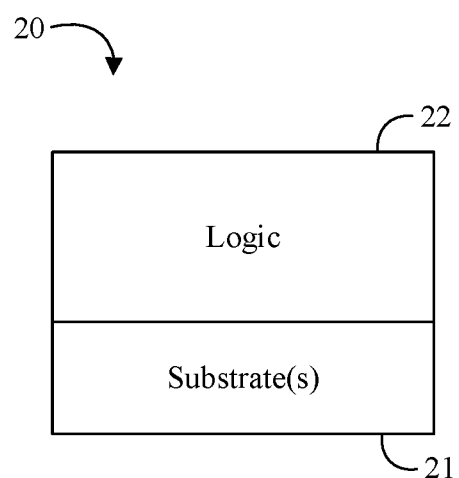
FIG. 2 is a block diagram of an example of a semiconductor apparatus according to an embodiment.

Turning now to FIG. 2, an embodiment of a semiconductor apparatus 20 may include one or more substrates 21, and logic 22 coupled to the one or more substrates 21, wherein the logic 22 is at least partly implemented in one or more of configurable logic and fixed-functionality hardware logic. The logic 22 coupled to the one or more substrates 21 may be configured to provide information related to one or more parity capabilities of a controller and a persistent storage media in response to an inquiry from a host device, and adjust one or more parameters related to the one or more parity capabilities of the controller and the persistent storage media in response to a request from the host device. In some embodiments, the logic 22 may be configured to perform parity accumulation on the persistent storage media in response to a request from the host device. Additionally, or alternatively, the logic 22 may be configured to perform parity storage on the persistent storage media in response to a request from the host device, and/or to perform parity-based rebuild on the persistent storage media in response to a request from the host device. In some embodiments, the logic 22 may be configured to process parity administration commands and I/O commands including one or more of a supported parity contexts inquiry administration command, a clear parity administration command, a read parity administration command, a write parity administration command, a write with parity I/O command, a flush parity I/O command, and a read accumulate I/O command. In any of the embodiments herein, the persistent storage media may include a SSD device. In some embodiments, the logic 22 coupled to the one or more substrates 21 may include transistor channel regions that are positioned within the one or more substrates 21.

Embodiments of logic 22, and other components of the apparatus 20, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

The apparatus 20 may implement one or more aspects of the method 30 (FIG. 3), or any of the embodiments discussed herein. In some embodiments, the illustrated apparatus 20 may include the one or more substrates 21 (e.g., silicon, sapphire, gallium arsenide) and the logic 22 (e.g., transistor array and other integrated circuit/IC components) coupled to the substrate(s) 21. The logic 22 may be implemented at least partly in configurable logic or fixed-functionality logic hardware. In one example, the logic 22 may include transistor channel regions that are positioned (e.g., embedded) within the substrate(s) 21. Thus, the interface between the logic 22 and the substrate(s) 21 may not be an abrupt junction. The logic 22 may also be considered to include an epitaxial layer that is grown on an initial wafer of the substrate(s) 21.

Figure 3:
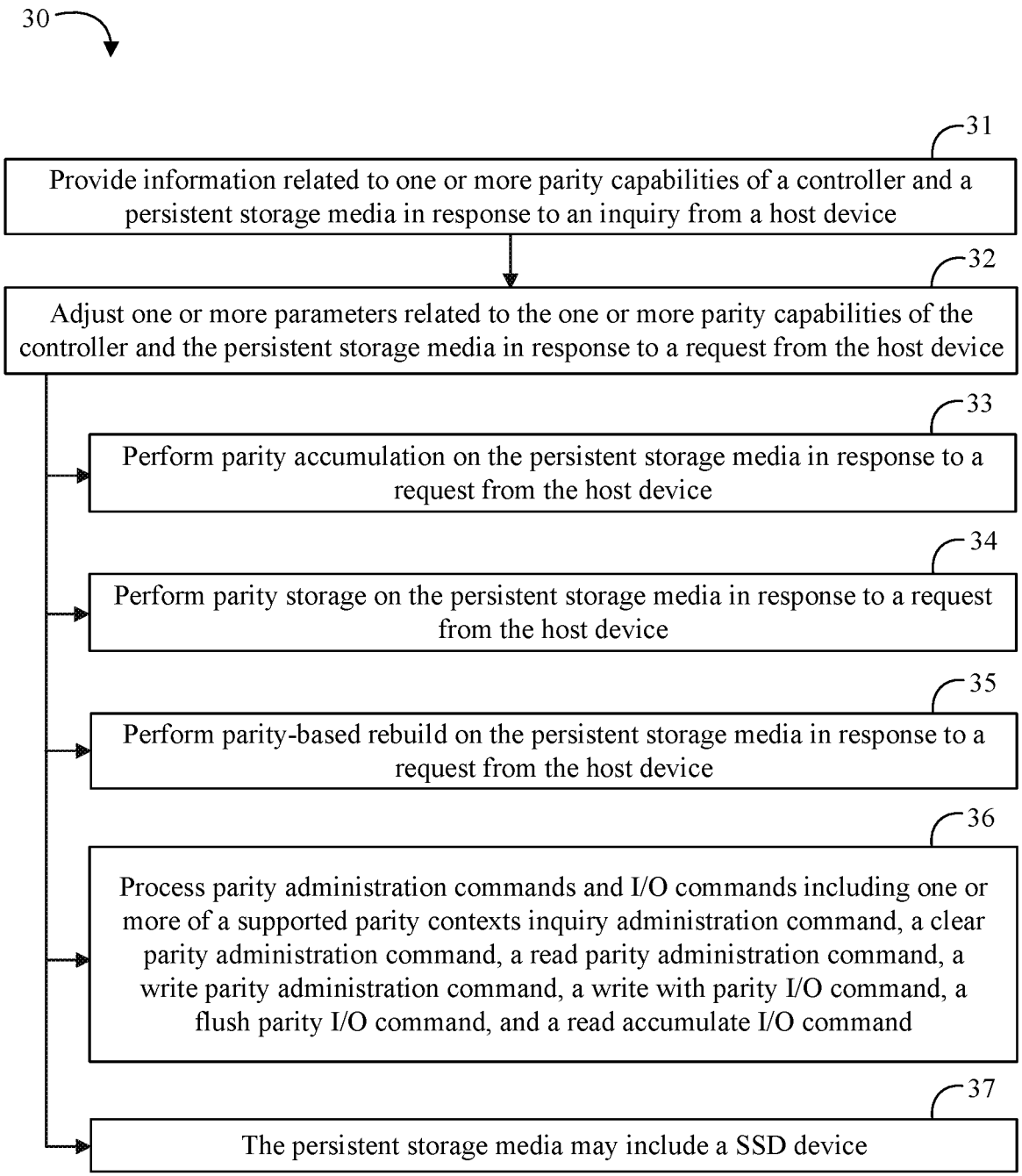
FIG. 3 is a flowchart of an example of a method of managing parity according to an embodiment.

Turning now to FIG. 3, an embodiment of a method 30 of managing parity may include providing information related to one or more parity capabilities of a controller and a persistent storage media in response to an inquiry from a host device at block 31, and adjusting one or more parameters related to the one or more parity capabilities of the controller and the persistent storage media in response to a request from the host device at block 32. Some embodiments of the method 30 may further include performing parity accumulation on the persistent storage media in response to a request from the host device at block 33. Additionally, or alternatively, some embodiments of the method 30 may include performing parity storage on the persistent storage media in response to a request from the host device at block 34, and/or performing parity-based rebuild on the persistent storage media in response to a request from the host device at block 35. For example, the method 30 may include processing parity administration commands and I/O commands including one or more of a supported parity contexts inquiry administration command, a clear parity administration command, a read parity administration command, a write parity administration command, a write with parity I/O command, a flush parity I/O command, and a read accumulate I/O command at block 36. In any of the embodiments herein, the persistent storage media may include a SSD device at block 37.

Embodiments of the method 30 may be implemented in a system, apparatus, computer, device, etc., for example, such as those described herein. More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the method 30 may be implemented on a computer readable medium as described in connection with Examples 20 to 25 below. Embodiments or portions of the method 30 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Some embodiments may advantageously provide technology to manage exclusive-or (XOR) parity on a physically addressable solid state device (e.g., a SSD). Conventional physically addressable solid state devices (e.g., OCSSD devices) lack a method to control on device XOR parity to mitigate uncorrectable events. A SSD may use XOR parity to mitigate a variety of uncorrectable events, including but not limited to high bit error rates, erase block failure, and die failure. For example, XOR parity may be used to reduce the uncorrectable bit error rate (UBER) of the storage media and error correction as applied to a logical block (LB). The magnitude of the reduction may be determined by the ratio of LBs to parity contexts stored to media. For example, a SSD may insert generated parity information in physical addresses that are not directly addressable by the host system. In conventional systems, the host device may have to control all of the media operations of the device, which may preclude any automated or device-assisted parity model. Some embodiments may provide a protocol that allows host identification and control of the parity capabilities of the storage device. For example, embodiments of the protocol may allow the host to offload the parity accumulation, storage, and/or rebuild to the target device.

Figure 4:
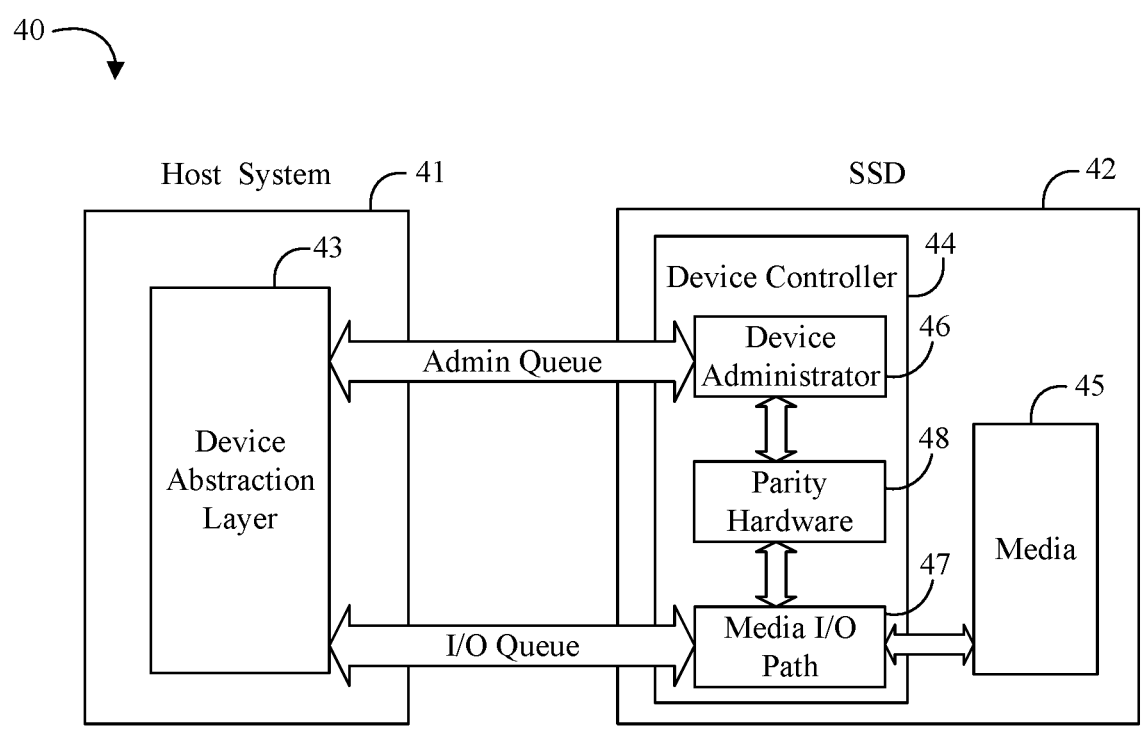
FIG. 4 is a block diagram of another example of an electronic processing system according to an embodiment.

Turning now to FIG. 4, an electronic processing system 40 may include a host system 41 communicatively coupled to a SSD 42. The host system 41 may include a device abstraction layer 43 to exchange commands and data with the SSD 42. The SSD 42 may include a device controller 44 coupled between the host system 41 and media 45 of the SSD 42. For example, the device controller 44 may include a device administrator 46, a media I/O path 47, and parity hardware 48 coupled between the device administrator 46 and the media I/O path 47. The system 40 may support an administration queue (Admin Queue) between the device abstraction layer 43 and the device administrator 46, and an I/O queue (I/O Queue) between the device abstraction layer 43 and the media I/O path 47. For example, the Admin Queue and the I/O Queue may provide command paths between the host system 41 and the SSD 42.

Some embodiments of a protocol may provide a set of administration commands to manage one or more parity contexts. Non-limiting examples of supported administration commands include one or more of a parity contexts supported command, a clear parity command, a read parity command, and a write parity command. In response to a parity contexts supported command, the SSD 42 may provide a return status to the host system 41 which indicates the number of parity contexts supported by the device hardware of the SSD 42 (e.g., a zero (0) may indicate that parity is not supported). Each of the clear parity, read parity, write parity, and read accumulate commands may include a context identifier. In response to the clear parity command from the host system 41, the SSD 42 may clear the contents of the identified parity context to zero (0). In response to the read parity command from the host system 41, the SSD 42 may return the contents of the identified parity context to the host system 41. In response to the write parity command from the host system 41, the SSD 42 may write the contents of the identified parity context with data provided by the host system 41.

Some embodiments of a protocol may provide a set of I/O commands (e.g., as additions to existing I/O commands) to operate the parity hardware 48. Non-limiting examples of such additional I/O commands may include a write with parity command, a flush parity command, and a read accumulate command. Each of the write with parity command, the flush parity command, and the read accumulate command may include a context identifier. In response to the write with parity command from the host system 41, the SSD 42 may write data to the media 45 at the indicated address and may accumulate the parity in the identified parity context. In response to the flush parity I/O command from the host system 41, the SSD 42 may write the contents of the identified parity context to the media 45 at the indicated address. In response to the read accumulate I/O command from the host system 41, the SSD 42 may read data from the media 45 and accumulates the parity into the identified parity context. Advantageously, the command may be performed entirely on the SSD 42 and no data is transferred to the host system 41.

Figure 5:
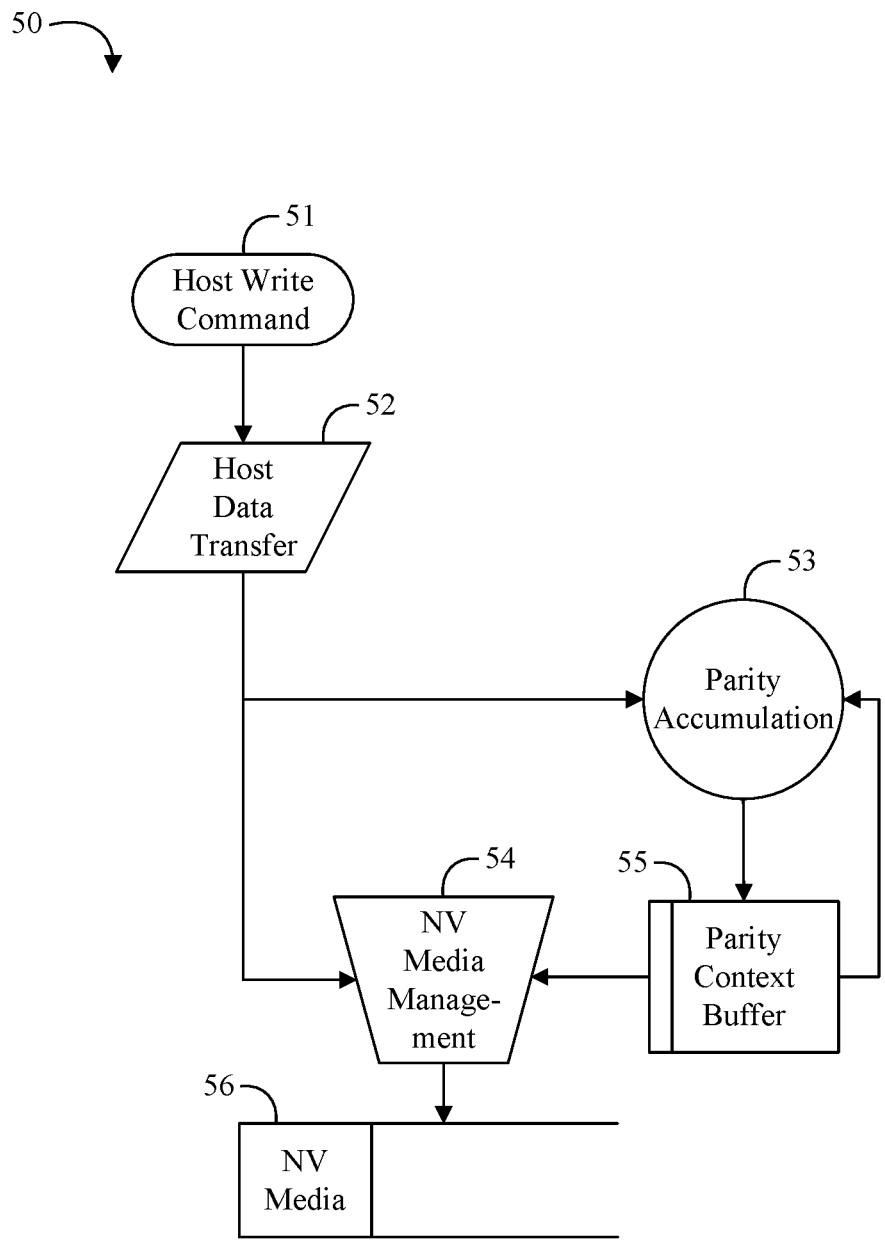
FIG. 5 is a flowchart of an example of a method of writing data according to an embodiment.

Turning now to FIG. 5, an embodiment of a method 50 of writing data may include processing a host write command at block 51 and initiating a host data transfer at block 52. The method 50 may include accumulating parity information at block 53 and performing nonvolatile (NV) media management at block 54. The method 50 may include storing the accumulated parity information in between operations in a parity context buffer at block 55. The method 50 may further include storing the host data and/or parity information on NV media at block 56 (e.g., based on the NV media management at block 54). For example, a parity context may encompass the data set used to generate the parity and the parity itself. A parity context buffer (PCB) may correspond to internal storage used to preserve the parity between operations. In some embodiments, a parity context identifier (PCID) may be used to tag which PCB is the target of an incoming command. For example, the PCIDs may be limited to a set of PCBs supported by the hardware and may be reused. In some embodiments, parity hardware (e.g., the parity hardware 48 from FIG. 4) may operate as a self-inverting function that accumulates the result of previous operations with the current operation into some form of intermediate storage (e.g., SRAM, DRAM, NVRAM, etc.). When the operation on the full data set of the parity context completes, the final parity may be stored to nonvolatile media (e.g., media 45 in FIG. 4).

Without being limited to specific implementations, some embodiments may provide a protocol with a set of Admin commands and/or I/O commands which abide by or extend the NVMe Specification 1.3. Advantageously, some embodiments may provide an extended protocol to manage parity contexts.

Turning now to FIG. 6, an embodiment of a parity context information log illustrates information that may be returned to the host in response to a request for parity capability information. For example, the parity context information log may use the NVMe standard Get Log Page command with a vendor specific Log Identifier to retrieve the details of parity context support.

Turning now to FIG. 7, an embodiment of an Admin Command may include an initialize parity context buffer Admin Command. In FIG. 7, Dword refers to a data word, and CDW0 corresponds to Command Dword 0. NSID corresponds to a Namespace identifier. In response to an initialize parity context buffer command from a host device, the SSD may initialize the buffer identified by a PCID in preparation for use with a different parity context.

Turning now to FIG. 8, an embodiment of an Admin Command may include a read parity context Admin Command. In FIG. 8, DPTR corresponds to a data pointer, and NDT corresponds to a number of Dwords in a data transfer. In response to a read parity context command from a host device, the SSD may return the contents of the specified PCB to the host.

Turning now to FIG. 9, an embodiment of an Admin Command may include a write parity context Admin Command. In response to a write parity context Admin Command from the host, data from the host may be written to the buffer indicated by the PCID. This operation may either overwrite or accumulate into the PCB. In some embodiments, no change to nonvolatile storage is performed by this command.

Turning now to FIG. 10, an embodiment of an I/O Command may include a write with parity I/O Command. Some embodiments of the I/O Commands may operate the parity hardware. For example, the write with parity I/O command may be implemented as an extension to the NVMe write command opcode 01h. In addition to the fields defined in the NVMe specification, DWord 2 may contains the PCID, and DWord 3 may contain an optional second PCID for use in more complex parity schemes (e.g., see the Single Device Product Code Examples below). The PCIDs may indicate which PCBs to accumulate with. MPTR may correspond to a metadata pointer. LBA may refer to a logical block address.

Turning now to FIG. 11, an embodiment of an I/O Command may include a flush parity context I/O Command. In response to a flush parity context I/O Command from a host device, the SSD may write the contents of the identified parity context to the media at the LB specified by the OCSSD LBA. The completion for this command may not be sent until the media program is complete. The completion entry for the command may follow the NVMe specification with the addition of the status codes (e.g., as defined in the OCSSD specification, Rev 2.0). Optionally, in some embodiments the flush parity operation may initialize the contents of the identified parity context after a successful write to media. This implicit reset may be enabled by a Set Features command or a flag in the in the flush parity context command.

Turning now to FIG. 12, an embodiment of an I/O Command may include a read accumulate I/O command. In response to a read accumulate I/O command from a host device, the SSD may read data from the media and accumulates the parity into the indicated parity context. In some embodiments, no data is transferred to the host device. If any of LBs specified in the command fail, an error correction status code of 2h may be entered in the completion queue entry for the command.

Single Device Single Context Use Case Examples

Figure 13:
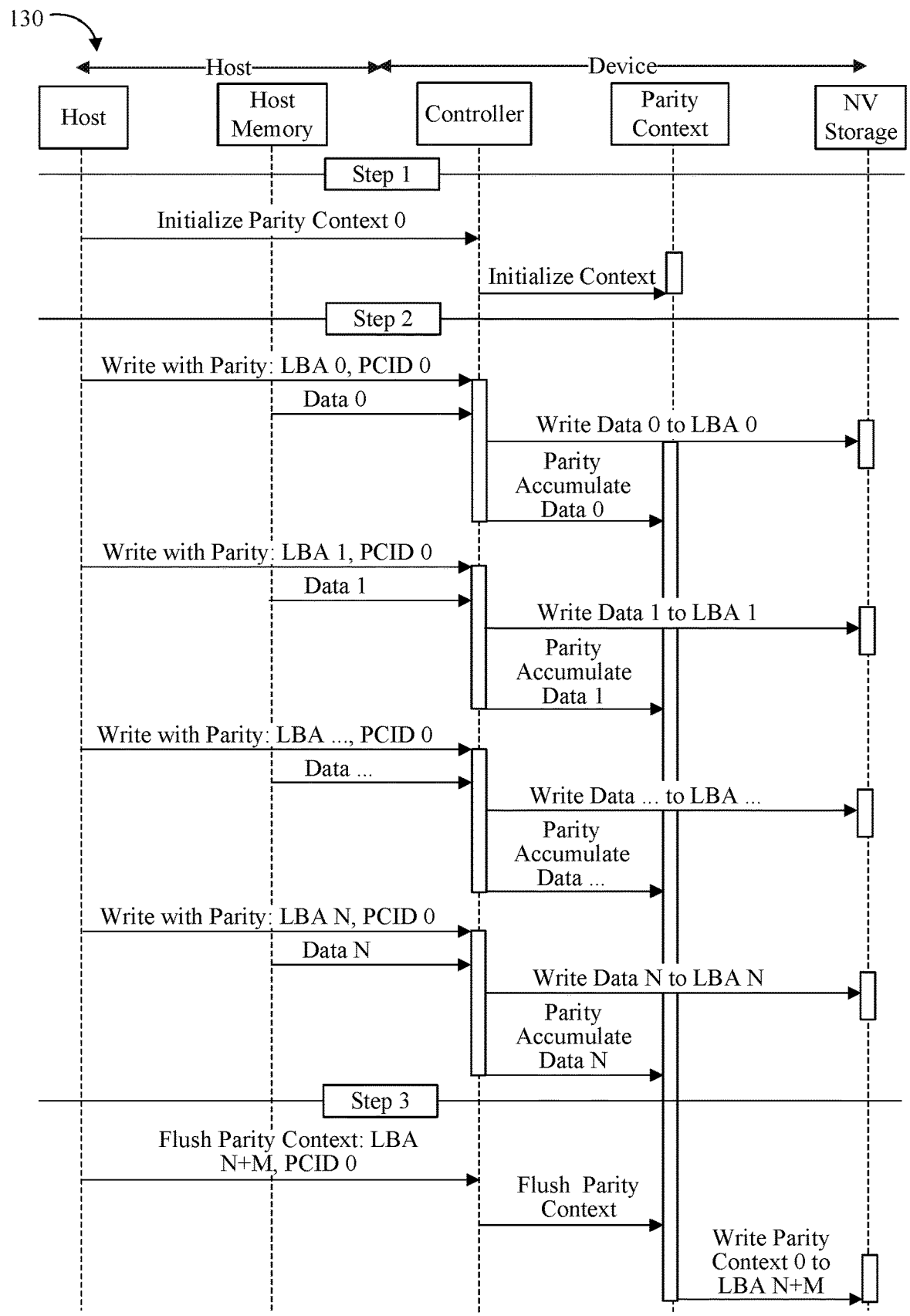
FIG. 13 is a process flow diagram of an example of a process flow for a single device, single context use case according to an embodiment.

Turning now to FIG. 13, an embodiment of a process flow 130 is shown for a single device, single context use case. For example, to successfully use the hardware accelerated parity engine included in an OCSSD device, the host may (1) initialize the context, (2) write with parity, and (3) flush parity context. The context initialization assures that the context buffer is cleared of any previous contents. When performing the write with parity command, all LBs with intended coverage by the context instance must use the same PCID. The write with parity operation may be repeated until the desired number of LBs in the parity context is reached. The flush parity context may store the parity context to media for later use. The flush parity context command may effectively checkpoint or close the parity context. After the flush parity command, the parity cycle may now be complete and use may continue (e.g., starting with Step 1 in FIG. 13).

Single Device Multiple Context Use Case Examples

Figure 14A:
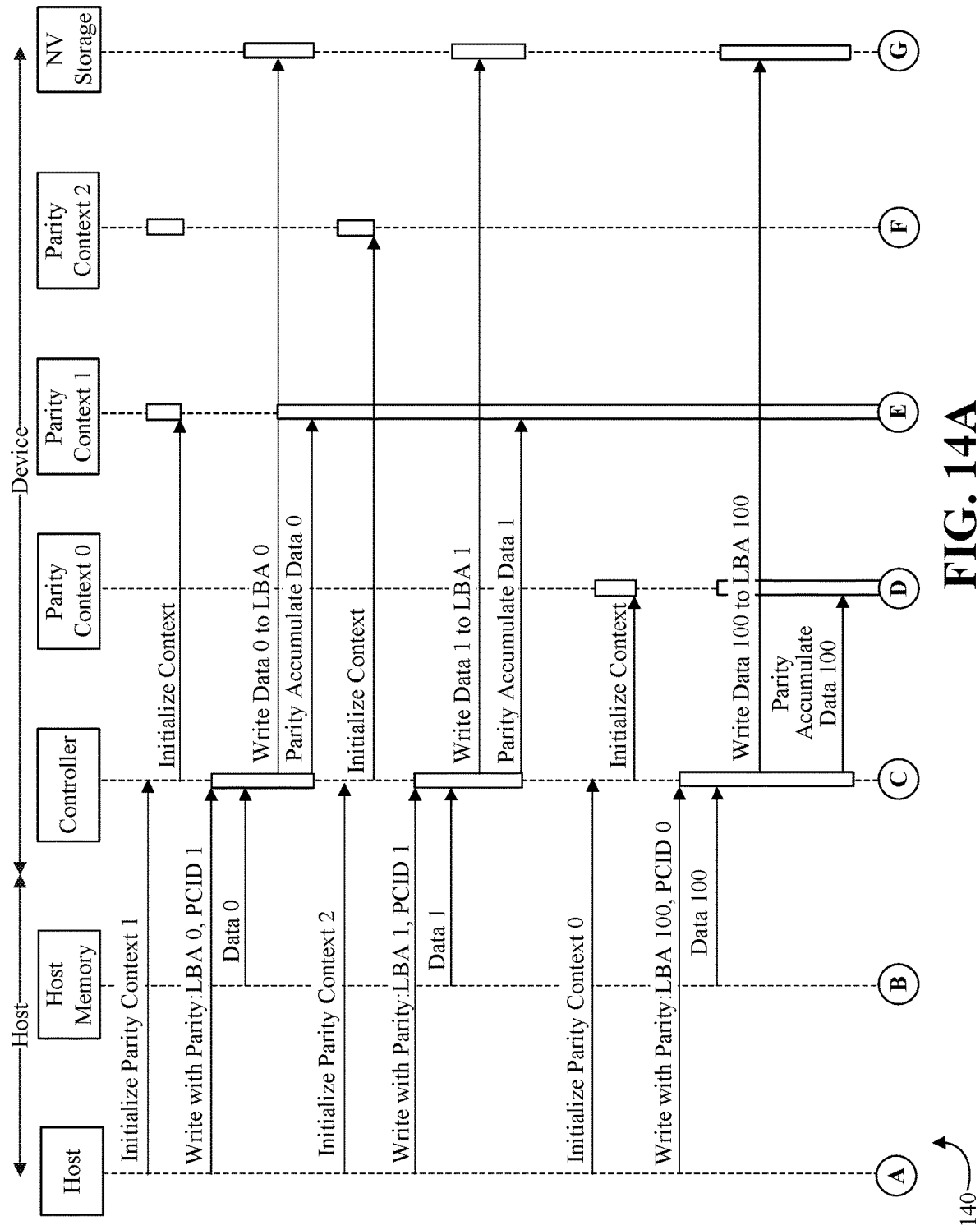
FIGS. 14A to 14C are process flow diagrams of an example of a process flow for a single device, multiple context use case according to an embodiment.
Figure 14B:
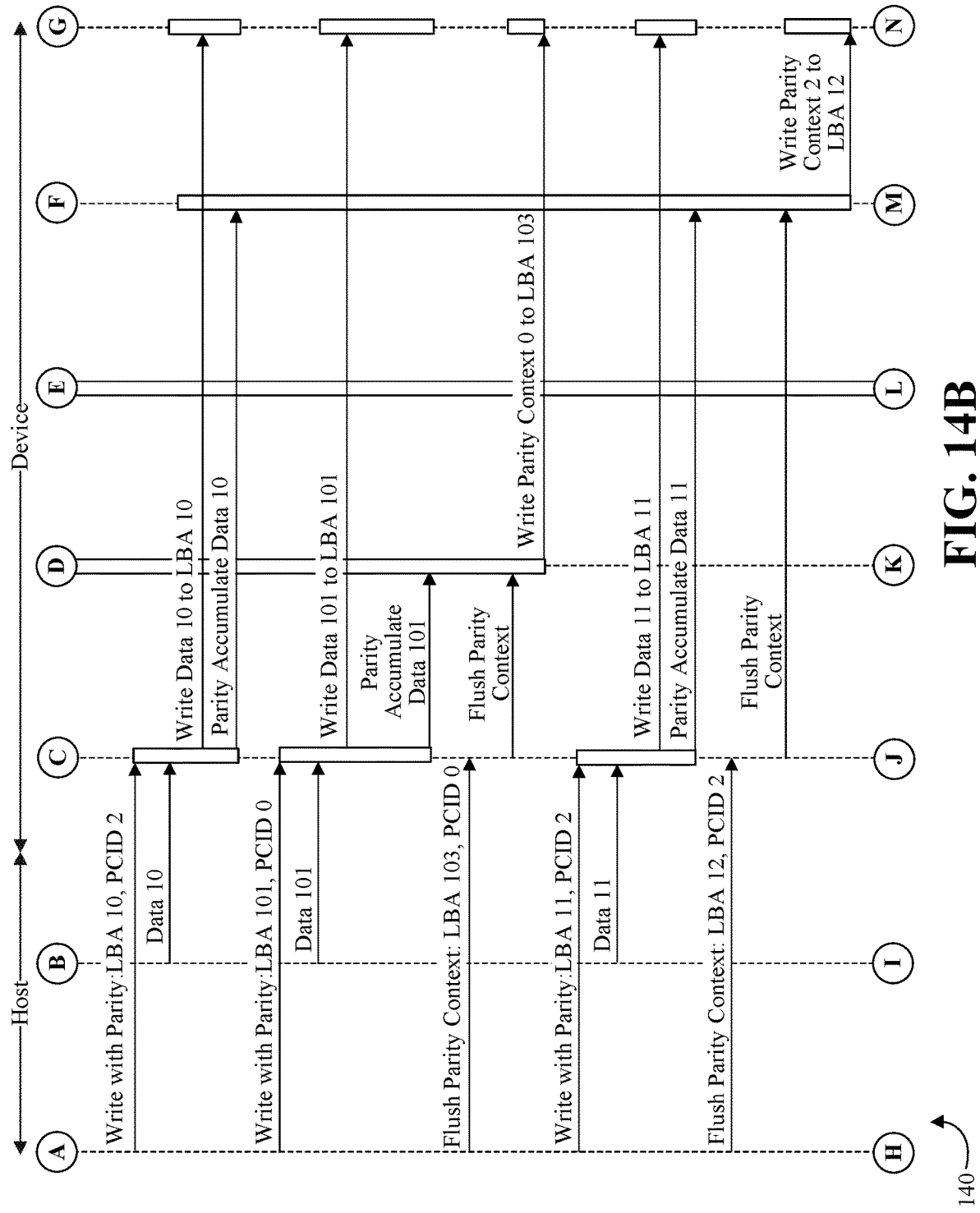
Figure 14C:
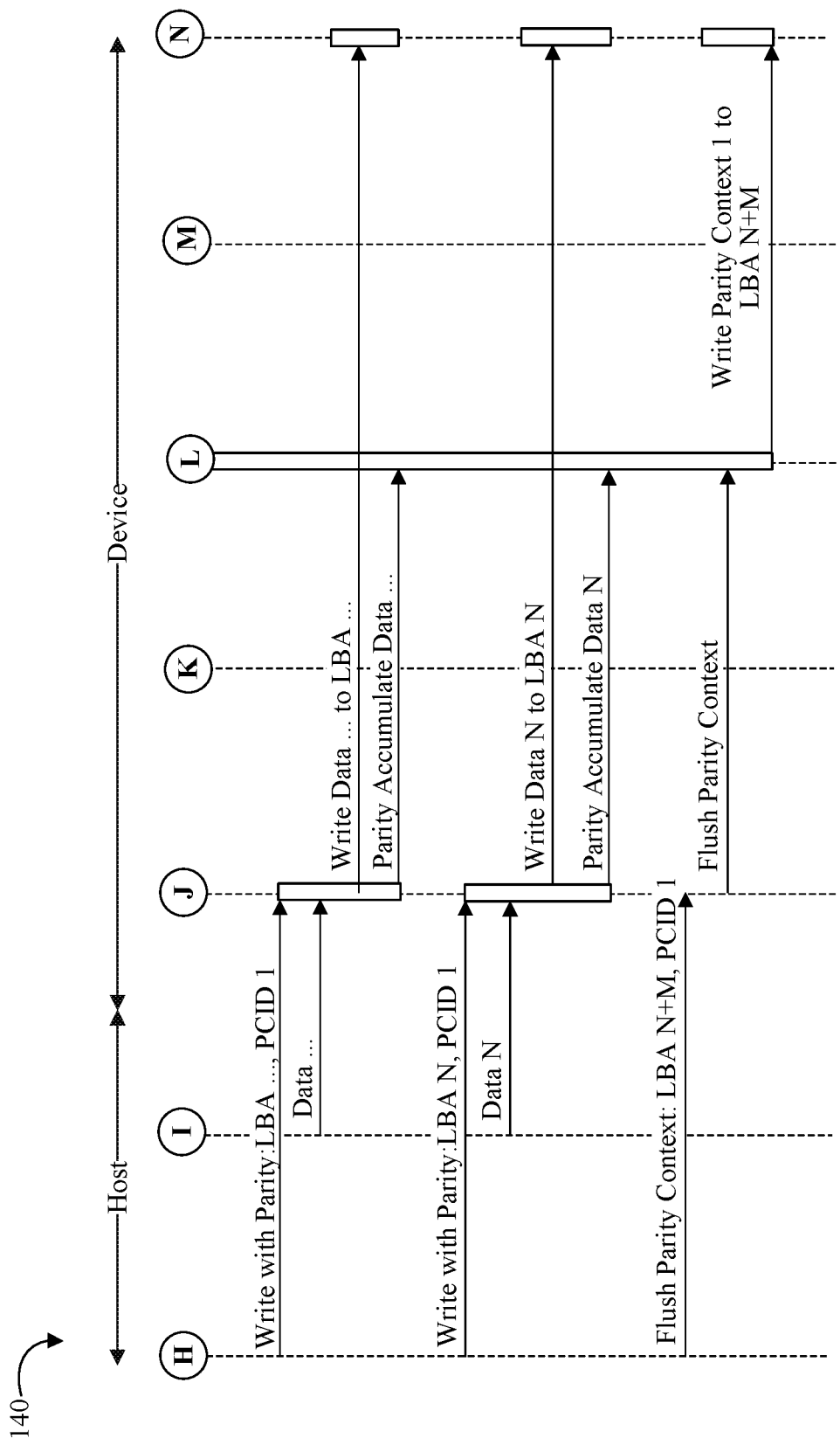

Turning now to FIGS. 14A to 14C, an embodiment of a process flow 140 may show a single device, multiple context use case. For example, devices that support multiple parity context buffers may enable support for multiple parity contexts without the overhead of reading and writing the parity buffer to and from the host. These contexts may be completely independent and may run concurrently. As shown in FIGS. 14A to 14C, the independence of the contexts may allow the host to set different levels of parity protection for each context. The overall process flow 140 may be similar to the single device single context process flow 130, except that (1) unique PCIDs may be assigned to each parity context, (2) each parity context may be initialized individually using the initialize parity command with a respective embedded PCID, (3) writes may be accumulated to each PCB based on the PCID included in the write with parity Submission Queue entry, (4) each flush parity context command may only affect the context associated with the embedded PCID, and (5) each parity context may support different parity to data ratios.

Single Device Product Code Examples

Figure 15:
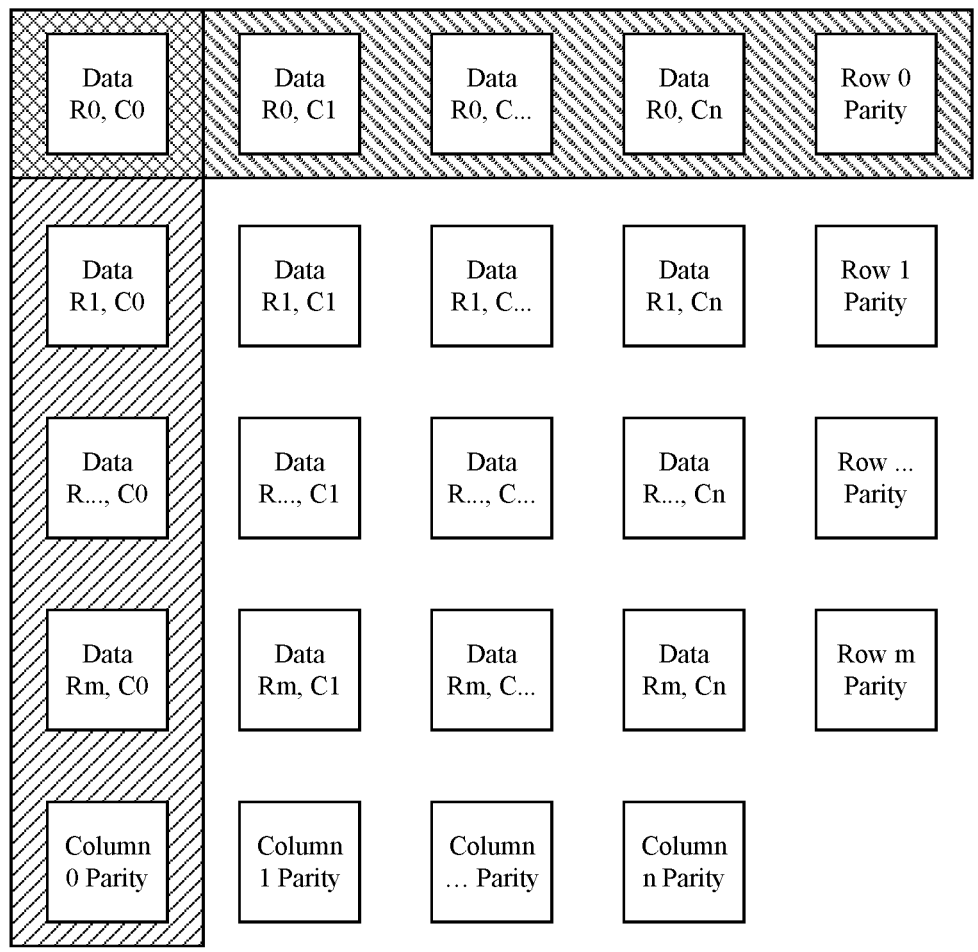
FIG. 15 is an illustrative diagram of an example of a product code layout according to an embodiment.

Turning now to FIG. 15, an embodiment of a product code layout may include rows and columns of data. The phrase "product code" may refer to a two dimensional scheme to cover double failures in an individual parity context. The top row may be a unique parity context, and the leftmost column may be a second unique parity context. The data in the top, left square may correspond to the intersection of the top row and leftmost column. Those skilled in the art will appreciate that the product code layout supports various permutations. Advantageously, some embodiments of a protocol may allow for both single device and device spanning product codes with hardware acceleration.

Figure 16A:
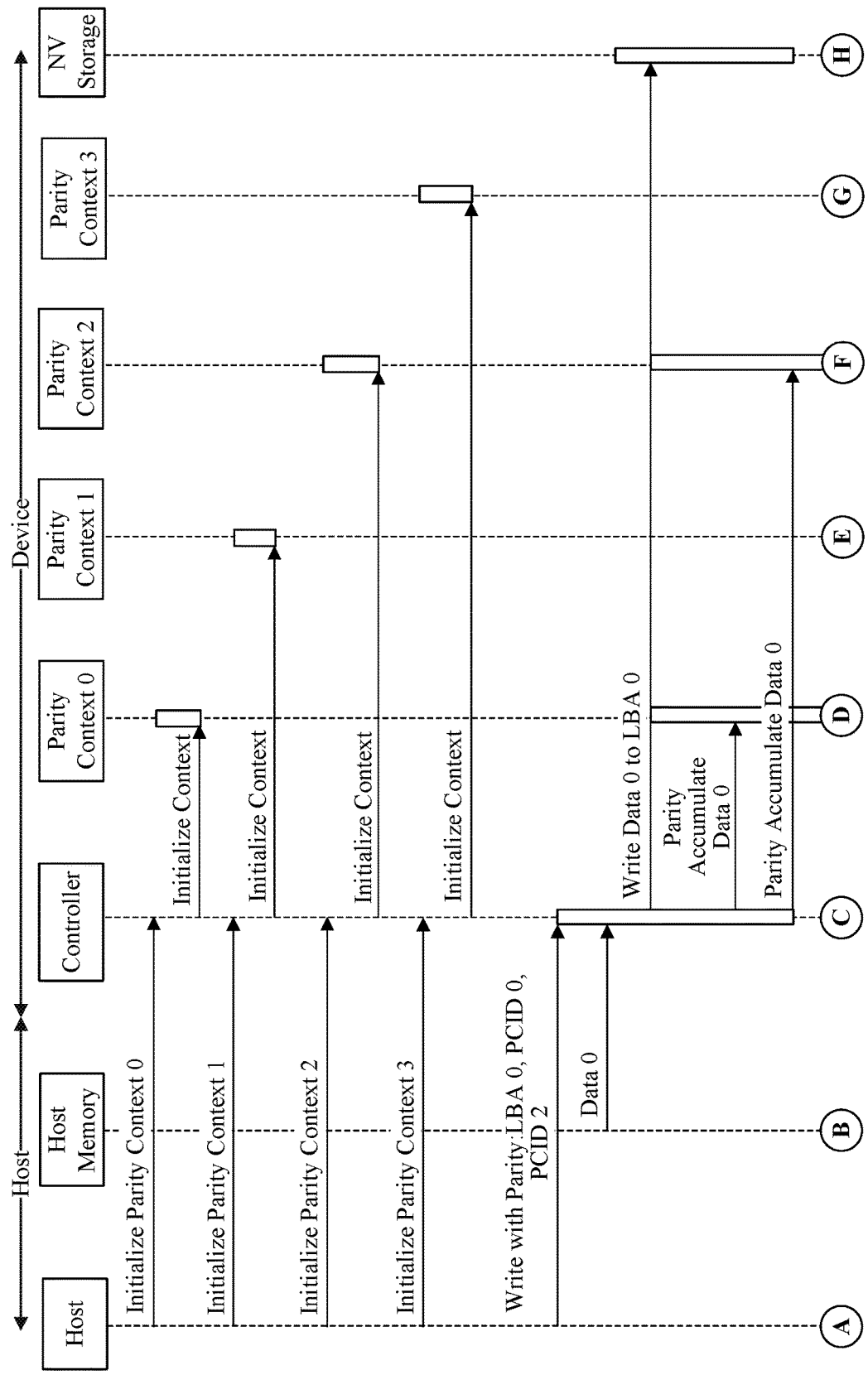
FIGS. 16A to 16C are process flow diagrams of an example of a process flow for a single device product code parity generation according to an embodiment.
Figure 16B:
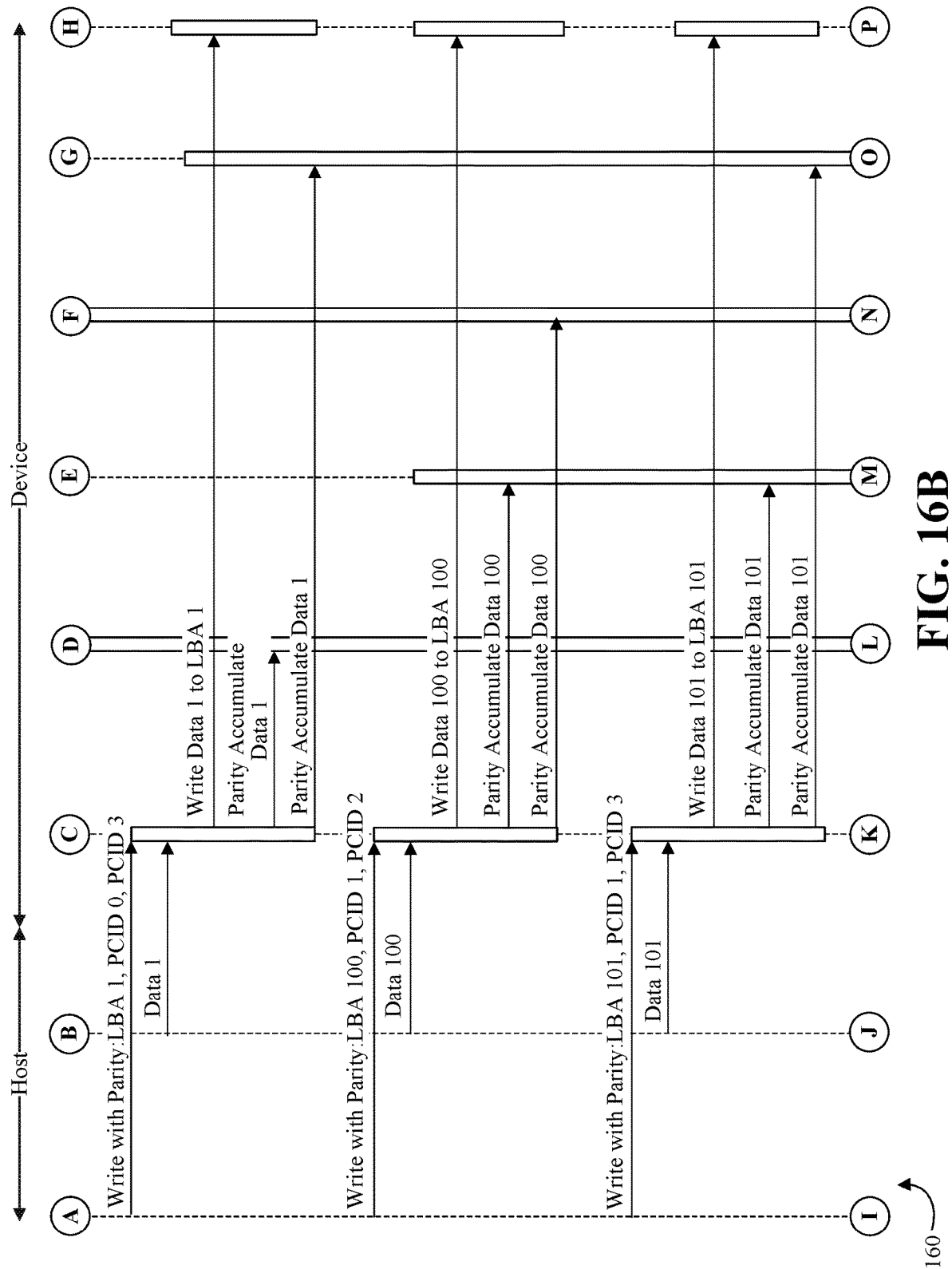
Figure 16C:
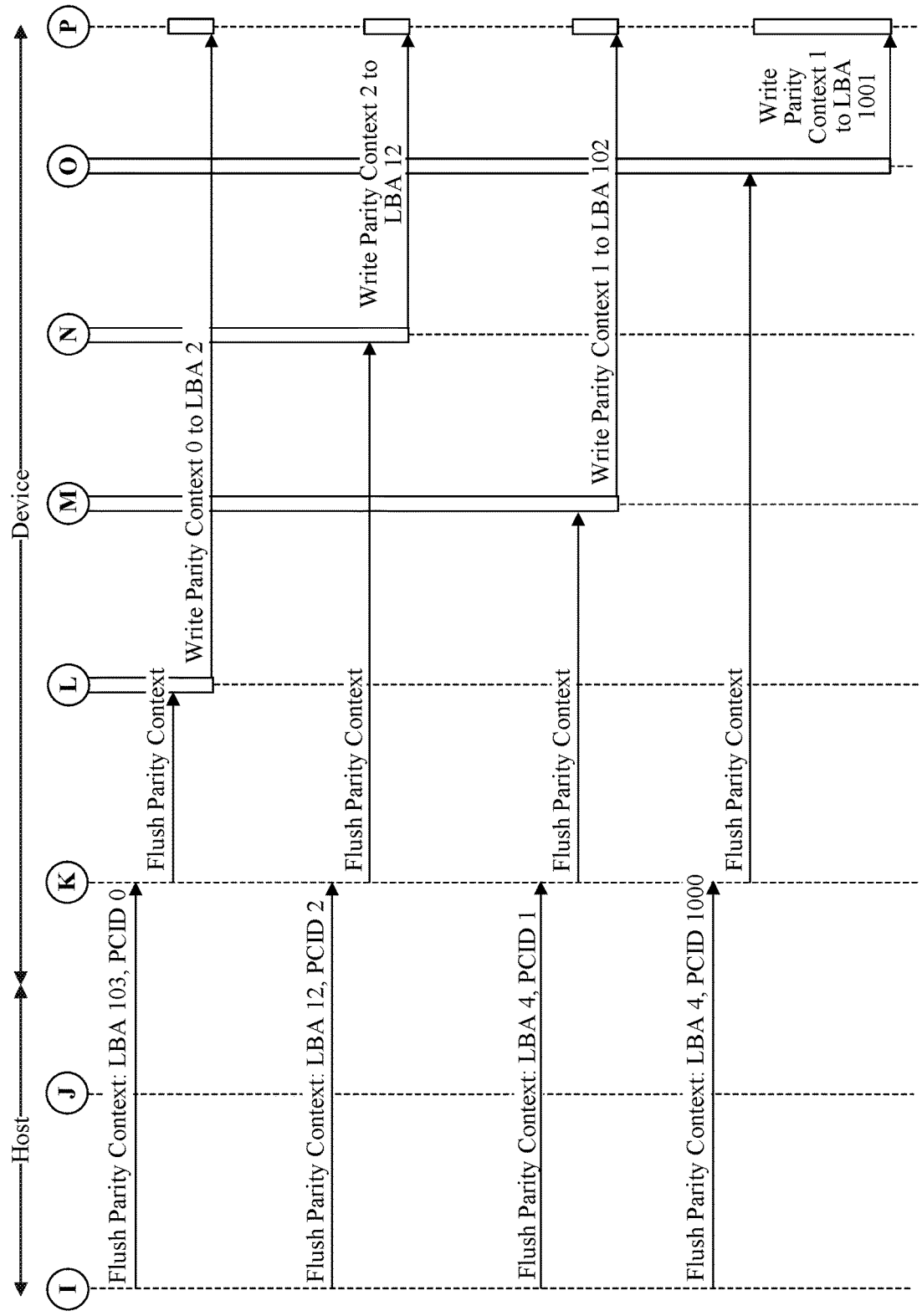

Turning now to FIGS. 16A to 16C, an embodiment of a process flow 160 may show an example command flow of a single device product code parity generation. A two by two product code is shown to reduce complexity. In practice, a product code may be significantly larger with dissimilar row and column dimensions. Some embodiments of the process flow 160 may be expanded to multiple devices (e.g., using a flow similar to the Multiple Device, Multiple Contexts examples).

Multiple Device Spanning Parity Examples

Figure 17A:
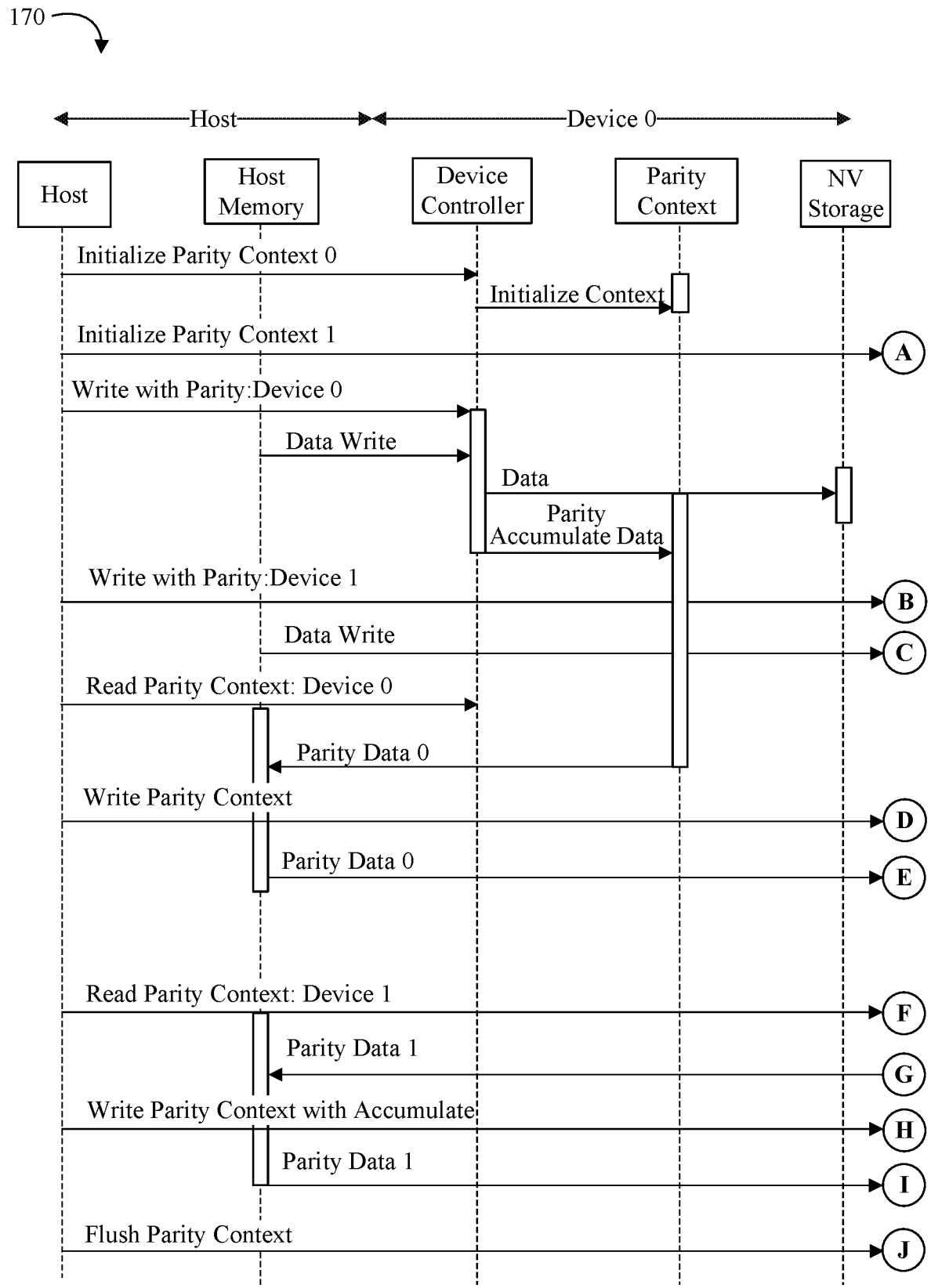
FIGS. 17A to 17B are process flow diagrams of an example of a process flow for a multiple device, single context use case according to an embodiment.
Figure 17B:
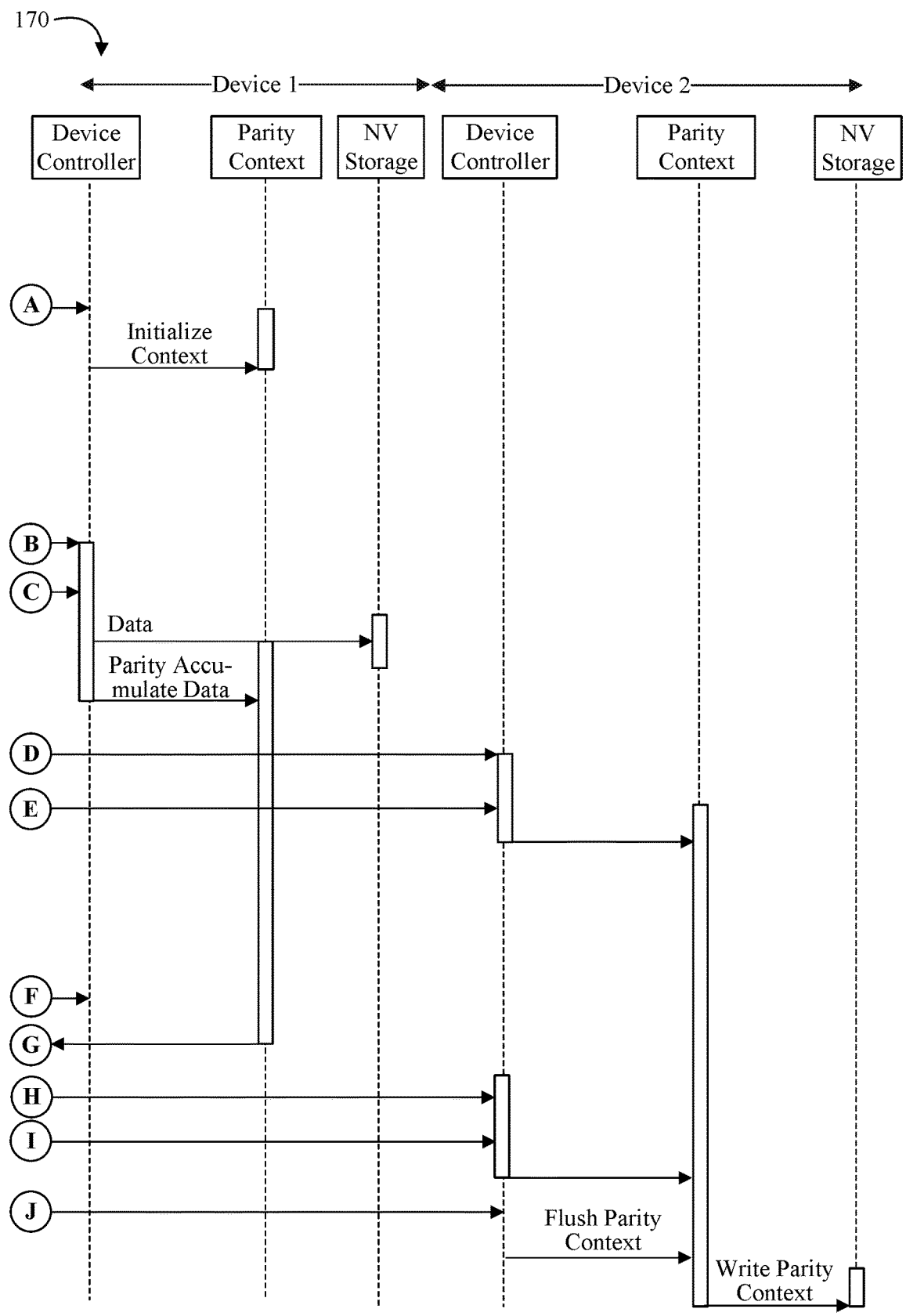

Turning now to FIGS. 17A to 17B, an embodiment of a process flow 170 is shown for a multiple device, single context use case (e.g., multiple devices are included in single parity context that is stored on an additional device). For example, a parity context may span multiple devices using the single device processes above in isolation or combination. When the segment of the parity context specific to the device completes: (1) the host may use the read parity context command to acquire the buffer contents, and (2) the host may use the write parity context to load the context into a different device (e.g., alternatively the host may use a normal flush parity or write with parity to the target device).

Figure 18A:
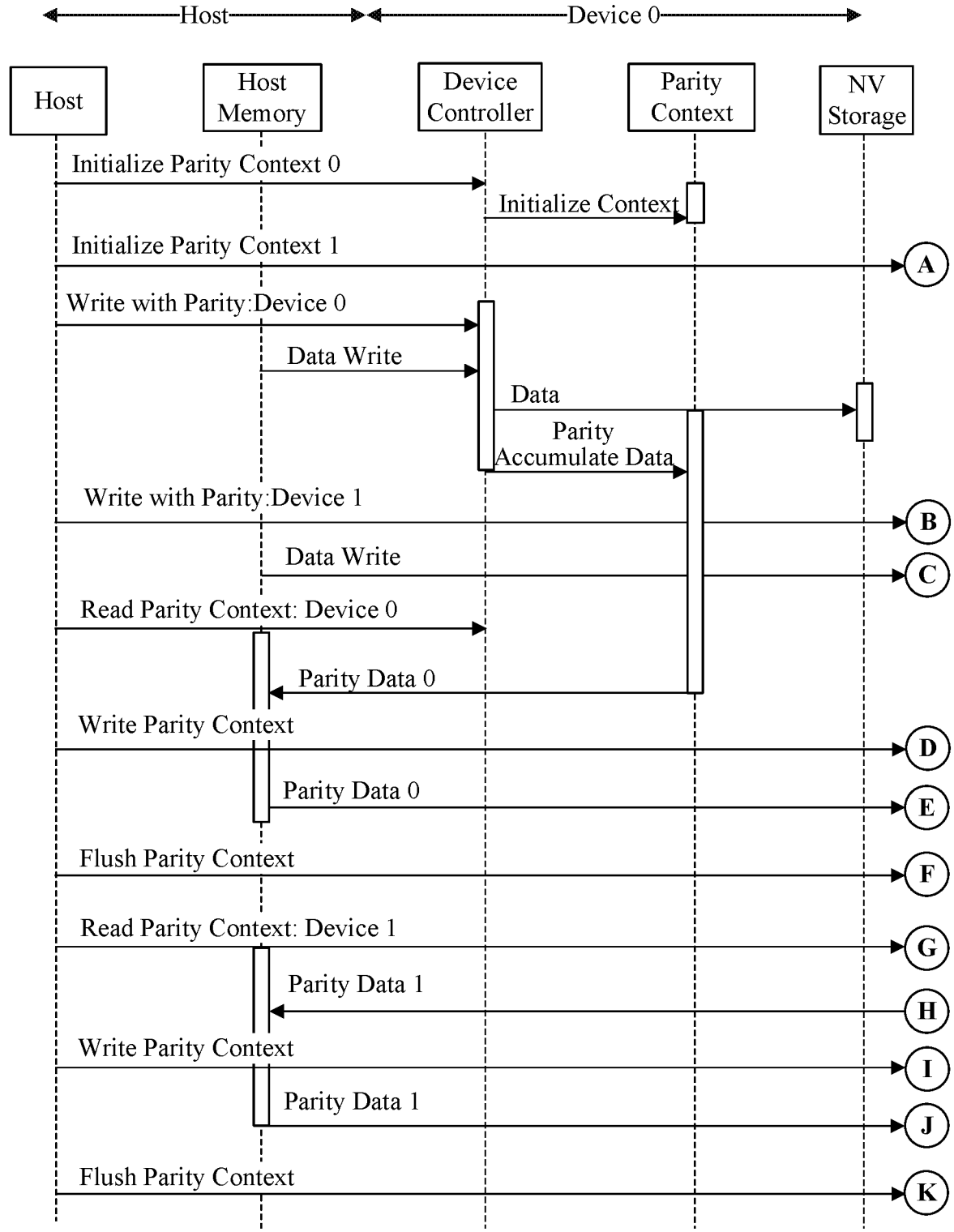
FIGS. 18A to 18B are process flow diagrams of an example of a process flow for a multiple device, multiple context use case according to an embodiment.
Figure 18B:
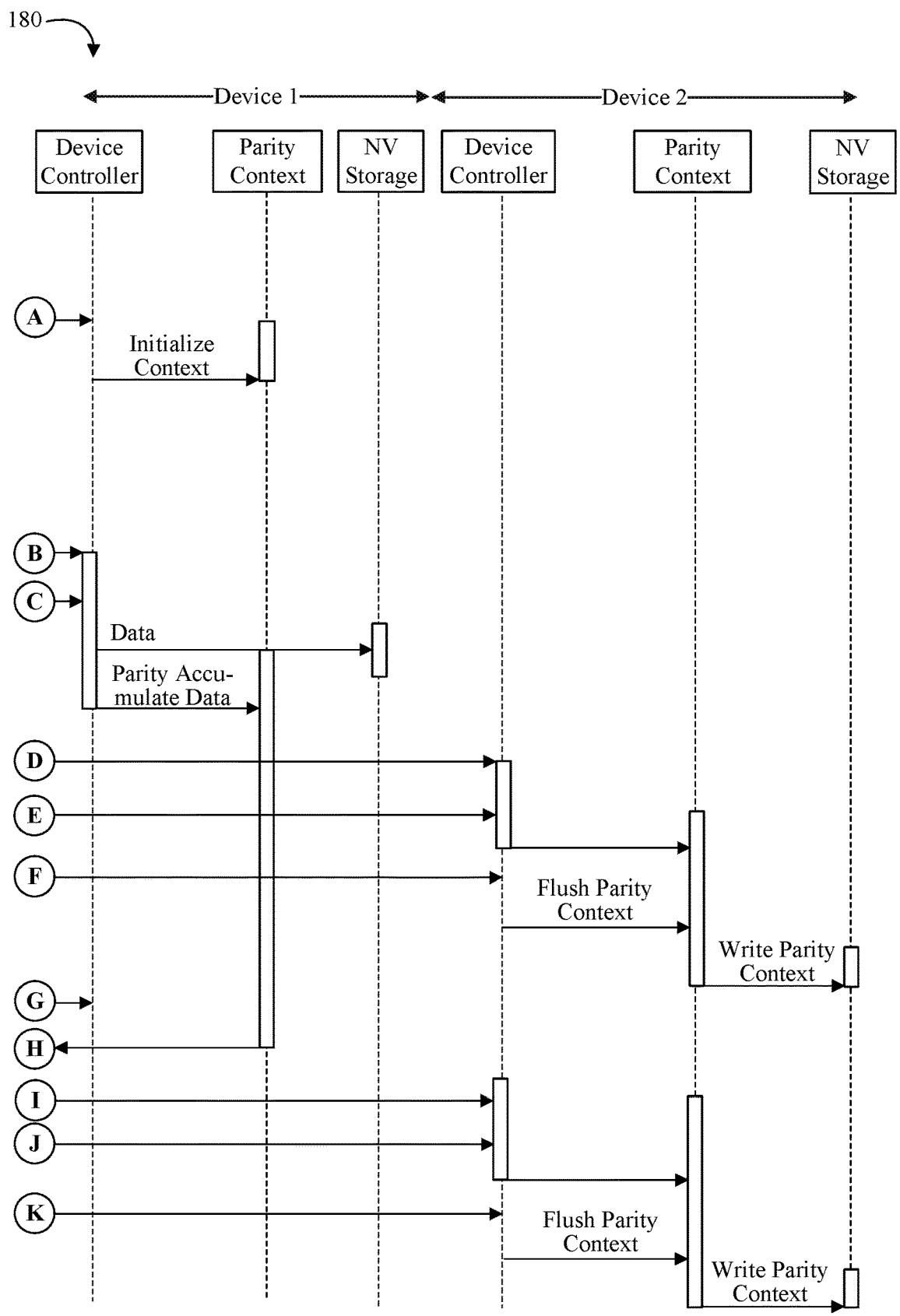

Turning now to FIGS. 18A to 18B, an embodiment of a process flow 180 is shown for a multiple device, multiple context use case. The process flow 180 shows an example of how individual parity contexts unique to a device may be stored on an additional device.

Data Rebuild Examples

Figure 19:
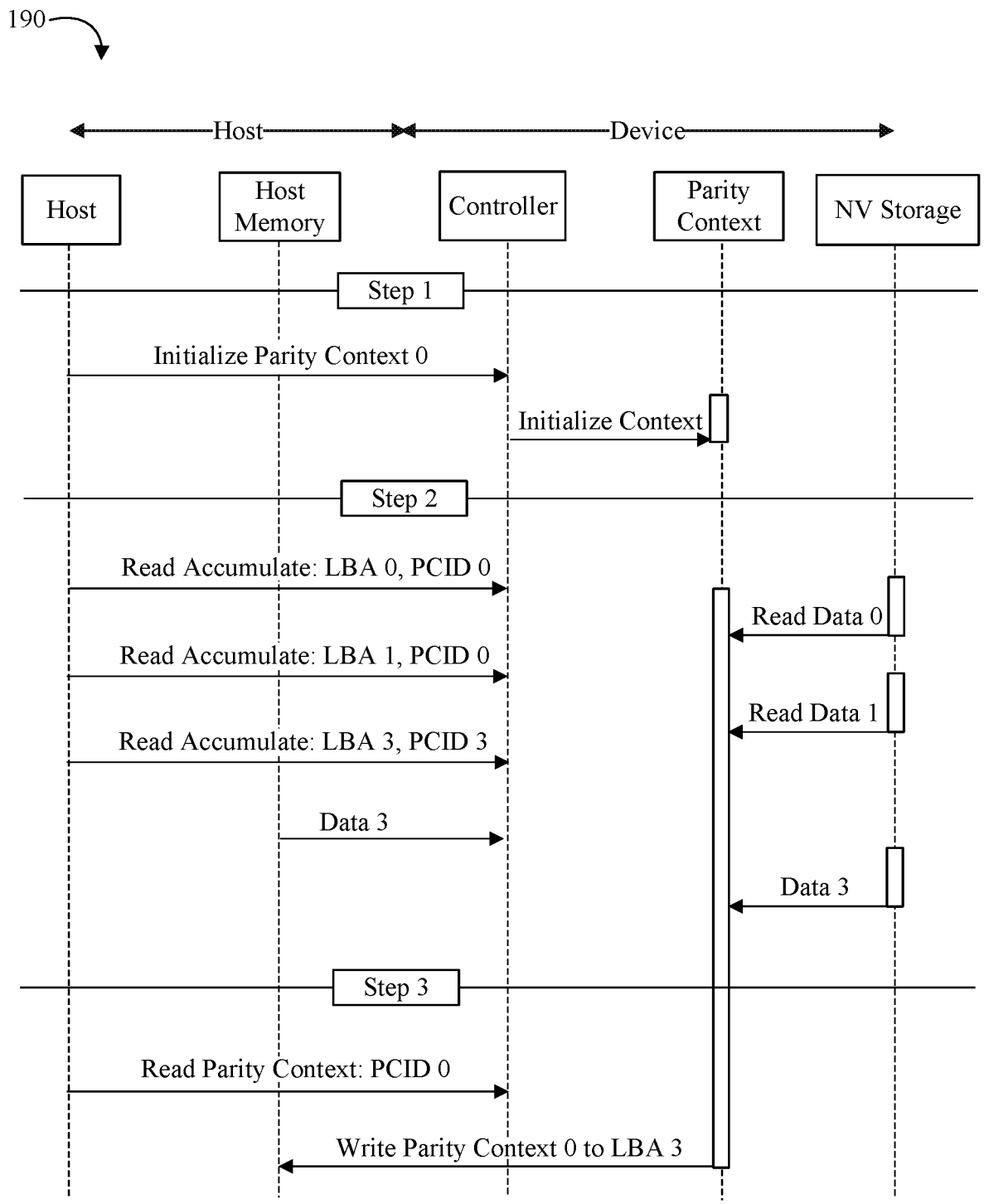
FIG. 19 is a process flow diagram of an example of a process flow for a data rebuild use case according to an embodiment.

Turning now to FIG. 19, an embodiment of a process flow 190 shows a data rebuild use case. As the host defines the data covered by an individual parity context, for example, the host may direct the rebuild process. Data rebuild may either be performed by the host reading the LBs that compose the parity context, except the unrecoverable LB, and then performing the inverse parity operation or using hardware acceleration. More complex data rebuild cases may essentially inverse processes of the original parity context creation and storage to NV media.

Power Loss Examples

In the event of an unexpected power loss, some embodiments may store the contents of the parity context buffers to a reserved system area. When power is restored the contents may be read from the system area and restored to the parity contexts they were in at the time power was lost. The parity context log data structure shown in FIG. 6 may include an entry for each parity restored. The scope of the parity context (e.g., the data used to create the parity) may be unknown to the device as it is defined by the host. The device(s) may preserve the parity in the expectation that the host tracking of the data included in an individual parity context is also protected and recoverable by the host after power loss.

Additional Notes and Examples

Example 1 may include an electronic processing system, comprising a controller, persistent storage media communicatively coupled to the controller, and logic communicatively coupled to the controller and the persistent storage media to provide information related to one or more parity capabilities of the controller and the persistent storage media in response to an inquiry from a host device, and adjust one or more parameters related to the one or more parity capabilities of the controller and the persistent storage media in response to a request from the host device.

Example 2 may include the system of Example 1, wherein the logic is further to perform parity accumulation on the persistent storage media in response to a request from the host device.

Example 3 may include the system of any of Examples 1 to 2, wherein the logic is further to perform parity storage on the persistent storage media in response to a request from the host device.

Example 4 may include the system of any of Examples 1 to 3, wherein the logic is further to perform parity-based rebuild on the persistent storage media in response to a request from the host device.

Example 5 may include the system of any of Examples 1 to 4, wherein the logic is further to process parity administration and input/output commands including one or more of a supported parity contexts inquiry administration command, a clear parity administration command, a read parity administration command, a write parity administration command, a write with parity input/output command, a flush parity input/output command, and a read accumulate input/output command.

Example 6 may include the system of any of Examples 1 to 5, wherein the persistent storage media comprises a solid state drive.

Example 7 may include a semiconductor apparatus, comprising one or more substrates, and logic coupled to the one or more substrates, wherein the logic is at least partly implemented in one or more of configurable logic and fixed-functionality hardware logic, the logic coupled to the one or more substrates to provide information related to one or more parity capabilities of a controller and a persistent storage media in response to an inquiry from a host device, and adjust one or more parameters related to the one or more parity capabilities of the controller and the persistent storage media in response to a request from the host device.

Example 8 may include the apparatus of Example 7, wherein the logic is further to perform parity accumulation on the persistent storage media in response to a request from the host device.

Example 9 may include the apparatus of any of Examples 7 to 8, wherein the logic is further to perform parity storage on the persistent storage media in response to a request from the host device.

Example 10 may include the apparatus of any of Examples 7 to 9, wherein the logic is further to perform parity-based rebuild on the persistent storage media in response to a request from the host device.

Example 11 may include the apparatus of any of Examples 7 to 10, wherein the logic is further to process parity administration and input/output commands including one or more of a supported parity contexts inquiry administration command, a clear parity administration command, a read parity administration command, a write parity administration command, a write with parity input/output command, a flush parity input/output command, and a read accumulate input/output command.

Example 12 may include the apparatus of any of Examples 7 to 11, wherein the persistent storage media comprises a solid state drive.

Example 13 may include the apparatus of any of Examples 7 to 12, wherein the logic coupled to the one or more substrates includes transistor channel regions that are positioned within the one or more substrates.

Example 14 may include a method of managing parity, comprising providing information related to one or more parity capabilities of a controller and a persistent storage media in response to an inquiry from a host device, and adjusting one or more parameters related to the one or more parity capabilities of the controller and the persistent storage media in response to a request from the host device.

Example 15 may include the method of Example 14, further comprising performing parity accumulation on the persistent storage media in response to a request from the host device.

Example 16 may include the method of any of Examples 14 to 15, further comprising performing parity storage on the persistent storage media in response to a request from the host device.

Example 17 may include the method of any of Examples 14 to 16, further comprising performing parity-based rebuild on the persistent storage media in response to a request from the host device.

Example 18 may include the method of any of Examples 14 to 17, further comprising processing parity administration and input/output commands including one or more of a supported parity contexts inquiry administration command, a clear parity administration command, a read parity administration command, a write parity administration command, a write with parity input/output command, a flush parity input/output command, and a read accumulate input/output command.

Example 19 may include the method of any of Examples 14 to 18, wherein the persistent storage media comprises a solid state drive.

Example 20 may include at least one computer readable storage medium, comprising a set of instructions, which when executed by a computing device, cause the computing device to provide information related to one or more parity capabilities of a controller and a persistent storage media in response to an inquiry from a host device, and adjust one or more parameters related to the one or more parity capabilities of the controller and the persistent storage media in response to a request from the host device.

Example 21 may include the at least one computer readable storage medium of Example 20, comprising a further set of instructions, which when executed by the computing device, cause the computing device to perform parity accumulation on the persistent storage media in response to a request from the host device.

Example 22 may include the at least one computer readable storage medium of any of Examples 20 to 21, comprising a further set of instructions, which when executed by the computing device, cause the computing device to perform parity storage on the persistent storage media in response to a request from the host device.

Example 23 may include the at least one computer readable storage medium of any of Examples 20 to 22, comprising a further set of instructions, which when executed by the computing device, cause the computing device to perform parity-based rebuild on the persistent storage media in response to a request from the host device.

Example 24 may include the at least one computer readable storage medium of any of Examples 20 to 23, comprising a further set of instructions, which when executed by the computing device, cause the computing device to process parity administration and input/output commands including one or more of a supported parity contexts inquiry administration command, a clear parity administration command, a read parity administration command, a write parity administration command, a write with parity input/output command, a flush parity input/output command, and a read accumulate input/output command.

Example 25 may include the at least one computer readable storage medium of any of Examples 20 to 24, wherein the persistent storage media comprises a solid state drive.

Example 26 may include a parity management apparatus, comprising means for providing information related to one or more parity capabilities of a controller and a persistent storage media in response to an inquiry from a host device, and means for adjusting one or more parameters related to the one or more parity capabilities of the controller and the persistent storage media in response to a request from the host device.

Example 27 may include the apparatus of Example 26, further comprising means for performing parity accumulation on the persistent storage media in response to a request from the host device.

Example 28 may include the apparatus of any of Examples 26 to 27, further comprising means for performing parity storage on the persistent storage media in response to a request from the host device.

Example 29 may include the apparatus of any of Examples 26 to 28, further comprising means for performing parity-based rebuild on the persistent storage media in response to a request from the host device.

Example 30 may include the apparatus of any of Examples 26 to 29, further comprising means for processing parity administration and input/output commands including one or more of a supported parity contexts inquiry administration command, a clear parity administration command, a read parity administration command, a write parity administration command, a write with parity input/output command, a flush parity input/output command, and a read accumulate input/output command.

Example 31 may include the apparatus of any of Examples 26 to 30, wherein the persistent storage media comprises a solid state drive.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. An electronic processing system, comprising:
   persistent storage media; and
   a controller including logic communicatively coupled to the persistent storage media to:
   provide information to a host device and in response to an inquiry from the host device, wherein the information is to be related to one or more parity capabilities of the controller and the persistent storage media, and wherein the information is to indicate a number of parity contexts that are to be supported by the persistent storage media,
   identify a first request from the host device that is to be associated with a first parity context of the parity contexts, and
   in response to the first request from the host device, adjust one or more parameters associated with the first parity context and related to the one or more parity capabilities.

2. The system of claim 1, wherein the logic is further to:
   perform parity accumulation on the persistent storage media in response to the first request from the host device.

3. The system of claim 1, wherein the logic is further to:
   perform parity storage on the persistent storage media in response to the first request from the host device.

4. The system of claim 1, wherein the logic is further to:
   perform parity-based rebuild on the persistent storage media in response to the first request from the host device.

5. The system of claim 1, wherein the logic is further to:
   process parity administration and input/output commands associated with one or more second requests from the host device and including one or more of a supported parity contexts inquiry administration command, a clear parity administration command, a read parity administration command, a write parity administration command, a write with parity input/output command, a flush parity input/output command, and a read accumulate input/output command.

6. The system of claim 1, wherein the persistent storage media comprises a solid state drive.

7. A semiconductor apparatus, comprising:
   one or more substrates; and
   logic coupled to the one or more substrates, wherein the logic is at least partly implemented in one or more of configurable logic or fixed-functionality logic hardware, the logic coupled to the one or more substrates to:
   provide information to a host device and in response to an inquiry from the host device, wherein the information is to be related to one or more parity capabilities of a controller and a persistent storage media, and wherein the information is to indicate a number of parity contexts that are to be supported by the persistent storage media,
   identify a first request from the host device that is to be associated with a first parity context of the parity contexts, and
   in response to the first request from the host device, adjust one or more parameters associated with the first parity context and related to the one or more parity capabilities.

8. The apparatus of claim 7, wherein the logic is further to:
   perform parity accumulation on the persistent storage media in response to the first request from the host device.

9. The apparatus of claim 7, wherein the logic is further to:
perform parity storage on the persistent storage media in response to the first request from the host device.

10. The apparatus of claim 7, wherein the logic is further to:
perform parity-based rebuild on the persistent storage media in response to the first request from the host device.

11. The apparatus of claim 7, wherein the logic is further to:
process parity administration and input/output commands associated with one or more second requests from the host device and including one or more of a supported parity contexts inquiry administration command, a clear parity administration command, a read parity administration command, a write parity administration command, a write with parity input/output command, a flush parity input/output command, and a read accumulate input/output command.

12. The apparatus of claim 7, wherein the persistent storage media comprises a solid state drive.

13. The apparatus of claim 7, wherein the logic coupled to the one or more substrates includes transistor channel regions that are positioned within the one or more substrates.

14. A method of managing parity, comprising:
providing information to a host device and in response to an inquiry from the host device, wherein the information is to be related to one or more parity capabilities of a controller and a persistent storage media, and wherein the information is to indicate a number of parity contexts that are to be supported by the persistent storage media;
identifying a first request from the host device that is to be associated with a first parity context of the parity contexts; and
in response to the first request from the host device, adjusting one or more parameters associated with the first parity context and related to the one or more parity capabilities.

15. The method of claim 14, further comprising:
performing parity accumulation on the persistent storage media in response to the first request from the host device.

16. The method of claim 14, further comprising:
performing parity storage on the persistent storage media in response to the first request from the host device.

17. The method of claim 14, further comprising:
performing parity-based rebuild on the persistent storage media in response to the first request from the host device.

18. The method of claim 14, further comprising:
processing parity administration and input/output commands associated with one or more second requests from the host device and including one or more of a supported parity contexts inquiry administration command, a clear parity administration command, a read parity administration command, a write parity administration command, a write with parity input/output command, a flush parity input/output command, and a read accumulate input/output command.

19. The method of claim 14, wherein the persistent storage media comprises a solid state drive.

20. At least one non-transitory computer readable storage medium, comprising a set of instructions, which when executed by a computing device, cause the computing device to:
provide information to a host device and in response to an inquiry from the host device, wherein the information is to be related to one or more parity capabilities of a controller and a persistent storage media, and wherein the information is to indicate a number of parity contexts that are to be supported by the persistent storage media;
identify a first request from the host device that is to be associated with a first parity context of the parity contexts; and
in response to the first request from the host device, adjust one or more parameters associated with the first parity context and related to the one or more parity capabilities.

21. The at least one non-transitory computer readable storage medium of claim 20, comprising a further set of instructions, which when executed by the computing device, cause the computing device to:
perform parity accumulation on the persistent storage media in response to the first request from the host device.

22. The at least one non-transitory computer readable storage medium of claim 20, comprising a further set of instructions, which when executed by the computing device, cause the computing device to:
perform parity storage on the persistent storage media in response to the first request from the host device.

23. The at least one non-transitory computer readable storage medium of claim 20, comprising a further set of instructions, which when executed by the computing device, cause the computing device to:
perform parity-based rebuild on the persistent storage media in response to the first request from the host device.

24. The at least one non-transitory computer readable storage medium of claim 20, comprising a further set of instructions, which when executed by the computing device, cause the computing device to:
process parity administration and input/output commands associated with one or more second requests from the host device and including one or more of a supported parity contexts inquiry administration command, a clear parity administration command, a read parity administration command, a write parity administration command, a write with parity input/output command, a flush parity input/output command, and a read accumulate input/output command.

25. The at least one non-transitory computer readable storage medium of claim 20, wherein the persistent storage media comprises a solid state drive.

* * * * *